US005639681A

United States Patent [19]
Carmody et al.

[11] Patent Number: 5,639,681
[45] Date of Patent: Jun. 17, 1997

[54] PROCESS FOR ELIMINATING EFFECT OF POLYSILICON STRINGERS IN SEMICONDUCTOR DEVICES

[75] Inventors: Kevin F. Carmody, Portland; Theodore C. Lemmond, Beaverton, both of Oreg.

[73] Assignee: Intel Corporation, Santa Clara, Calif.

[21] Appl. No.: 372,992

[22] Filed: Jan. 17, 1995

[51] Int. Cl.$^6$ ............................................. H01L 21/8247
[52] U.S. Cl. ............................ 437/52; 437/43; 437/48; 437/233
[58] Field of Search .................. 437/43, 48, 52, 437/233; 257/315; 365/185; 156/643

[56] References Cited

U.S. PATENT DOCUMENTS

| | | |
|---|---|---|
| 4,142,926 | 3/1979 | Morgan . |
| 4,536,947 | 8/1985 | Bohr et al. . |
| 4,780,424 | 10/1988 | Holler et al. . |
| 4,829,351 | 5/1989 | Engles et al. ............... 365/185 |
| 4,888,298 | 12/1989 | Rivaud et al. .............. 437/43 |
| 5,017,265 | 5/1991 | Park et al. . |
| 5,019,527 | 5/1991 | Ohshima et al. ............ 437/43 |
| 5,070,032 | 12/1991 | Yuam et al. ................. 437/43 |

FOREIGN PATENT DOCUMENTS 0051574  3/1984  Japan .

OTHER PUBLICATIONS

"Multi-Etchant Loading Effect and Silicon Etching in ClF3 and Related Mixtures", by Flam, Wang and Maydan, *Journal of Electrochemical Society: Solid-State Science and Technology.*

*Primary Examiner*—Tom Thomas
*Attorney, Agent, or Firm*—Blakely, Sokoloff, Taylor & Zafman

[57] ABSTRACT

A process for eliminating the effects of parasitic paths from stringers by forming diversionary paths in the overhangs in which the stringers are formed. The diversionary paths are selected such that the stringers formed in these paths are harmless to the operation of the circuit. For instance, in the formation of floating gate memory array where first and second polysilicon lines are formed are right angles to each other and then the first lines are etched in alignment with the second line to form the floating gates the invention is implemented by forming gaps in the first lines between the second lines. In this way, stringers formed from the second polysilicon layer are diverted. Consequently, the parasitic paths are paths in parallel with the second lines (word lines) instead of shorts between adjacent word lines.

8 Claims, 3 Drawing Sheets

5,639,681

PROCESS FOR ELIMINATING EFFECT OF POLYSILICON STRINGERS IN SEMICONDUCTOR DEVICES

BACKGROUND OF THE INVENTION

1. Field of the Invention

The field of the invention relates to semiconductor processing, particularly parasitic paths resulting from stingers.

2. Prior art

During the fabrication of semiconductor devices, overhangs or crevices are sometimes formed in integrated circuit structures. For instance, etching and/or the formation of insulative regions may result in the formation of overhangs, crevices, or the like (hereinafter collectively referred to as overhangs). A subsequently formed conductive layer may be deposited within the overhangs. When this conductive layer is etched with an anisotropic etchant to define a circuit element for the integrated circuit, portions of the layer (referred to as "stringers") may remain within the overhangs. Stringers often define parasitic paths harmful to the operation of the integrated circuit.

One method for removing stringers is to alter the chemistry of an anisotropic etch at or near its end point to make it more isotropic. The conductive material within the overhang is etched as the etching becomes more isotropic. This is described in "Multi-Etchant Loading Effect and Silicon Etching in ClF$_3$ and Related Mixtures", by Flam, Wang and Maydan, *Journal of Electrochemical Society: Solid-State Science and Technology*, December 1982, beginning at page 2755. Also see U.S. Pat. No. 5,071,265. One problem with this technique is that the critical dimensions are altered when the isotropic etching occurs. Another process for dealing with stringers is described in U.S. Pat. 4,536,947, FIGS. 11-14.

The formation of stringers often occurs where two layers of polysilicon are used. One process with two layers of polysilicon is used to fabricate electrically programmable memory arrays where each memory cell has a floating gate. In this well-known process, first parallel spaced-apart lines are formed from a first layer of polysilicon. Then from a second layer of polysilicon, insulated from the first lines, second parallel spaced-apart lines are formed, at right angles to the first lines. Following this, the first lines are etched in alignment with the second lines to form the floating gates from the first lines. The second lines become the word lines in the memory array. Numerous other fabrication steps for the memory array are omitted from this discussion. Formation of memory cells and arrays using this processing are described in U.S. Pat. Nos. 4,142,926 and 4,780,424.

In this process stringers can result from fragments of the second polysilicon layer especially where the first layer of polysilicon is initially etched after the etching of the dielectric used between the first and second layers. These stringers reside in overhangs formed in the bases of the first polysilicon lines. Conductive paths between adjacent word lines caused by these stringers render the array inoperative. This problem will be discussed in more detail in conjunction with the figures.

The present invention is described in conjunction with eliminating the effects of the stringers while fabricating a memory array using two layers of polysilicon.

SUMMARY OF THE INVENTION

The present invention provides an improvement in the process of fabricating semiconductor devices where circuit structures are formed having overhangs and where stringers from a subsequently formed conductive layer remain within the overhangs after the etching of the conductive layer into circuit elements. The stringers provide parasitic paths within the semiconductor device which are harmful to the operation of the device. With the processing of the present invention, interstices are formed in the circuit structures such that diversions occur in the overhangs. While the circuit elements are formed from the subsequently deposited conductive layer, the stringers are again formed, however, the stringers are diverted at the interstices thereby altering the parasitic paths.

Thus, instead of removing the stringers the present invention provides alternate paths for the stringers. Alternate paths are selected which are harmless to the operation of the circuit. Accordingly, while the stringers remain in the circuit they do not disturb the operation of the circuit.

BRIEF DESCRIPTION OF THE DRAWINGS

FIG. 9 is used to illustrate the diverted parasitic paths that result from use of the present invention.

DETAILED DESCRIPTION OF THE PRESENT INVENTION

Improved processing is described which eliminates the harmful effects of stringers in an integrated circuit. The present invention is described in conjunction with the formation of a memory array using two layers of polysilicon. It will be apparent to one skilled in the art that the present invention may be employed in the formation of other integrated circuits.

For the most part in the prior art, when stringers cause parasitic paths which are detrimental to the operation of an integrated circuit, the stringers are removed or other steps taken to prevent their formation. The present invention provides a departure from this approach by, in effect, living with the stringers by diverting the parasitic paths that they cause so that they are harmless to the operation of the circuit. That is, the stringers are not removed but rather made harmless.

Figure 1:
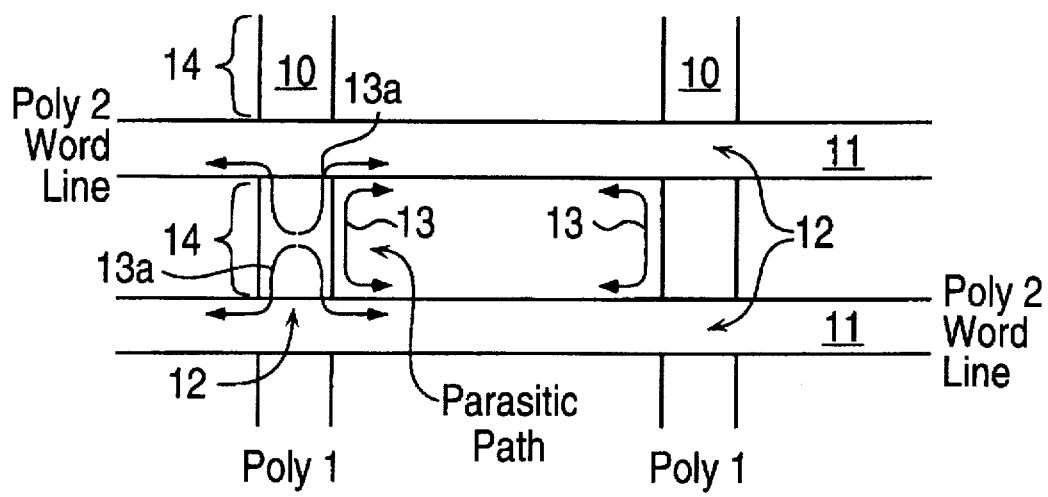
FIG. 1 is a plan view of an integrated circuit showing first and second polysilicon lines which are formed during the fabrication of a memory array. This figure is used to show the potentially damaging parasitic paths that can result from stringers and the alternate paths provided by the present invention.

The problem associated with stringers in the fabrication of certain floating gate memory arrays is illustrated in FIG. 1. Note that for discussions below numerous processing steps such as the growing and/or depositing of insulative layers, implantation of dopants, etc., are not described. Rather, only those aspects of the fabrication of the memory array needed to illustrate the formation of the stringers and the resultant parasitic paths are discussed or shown.

In the formation of such memory arrays a plurality of parallel, spaced-apart, elongated polysilicon lines 10 are etched from a first layer of polysilicon using well-known photolithographic techniques. Subsequently, a second layer of polysilicon is formed over the lines 10 and insulated from the lines 10. This second layer of polysilicon is masked and etched again using well-known photolithographic techniques to form a plurality of parallel, spaced-apart, elongated polysilicon lines 11 which are orthogonal to the lines 10. Note, as shown in FIG. 1, the lines 11 pass over and are insulated from the lines 10 at the intersections of lines 10 and 11.

After the formation of the word lines 11, the lines 10 are etched in alignment with the lines 11. This etching step as well as the other etching steps previously discussed use plasma etching to provide anisotropic etching. The segments 14 of the lines 10 are removed leaving only the portions of the lines 10 underlying the lines 11 shown by the numeral 12. Those portions of the lines 10 that remain are the floating gates of the memory cells used to store electrical charge.

Prior to the deposition of the second layer of polysilicon insulated overhangs form at the bases of the lines 10 as will be discussed. When the second polysilicon layer is deposited, it fills these overhangs. The anisotropic etching used to define the lines 11 leaves in place the polysilicon stringers in the overhangs. Thus, when the segments 14 of the lines 10 are removed, stringers remain which provide parasitic paths shown as paths 13 of FIG. 1. These paths provide an electrical connection between adjacent word lines and accordingly, if allowed to remain, would make the memory array inoperative.

As will be discussed in greater detail in this patent application, with the present invention, each stringer is made to start and end at the same word line, thus the stringers do not effect the operation of the memory array. With the present invention the parasitic paths resulting from the stringers is shown by paths 13a instead of path 13.

Figure 2:
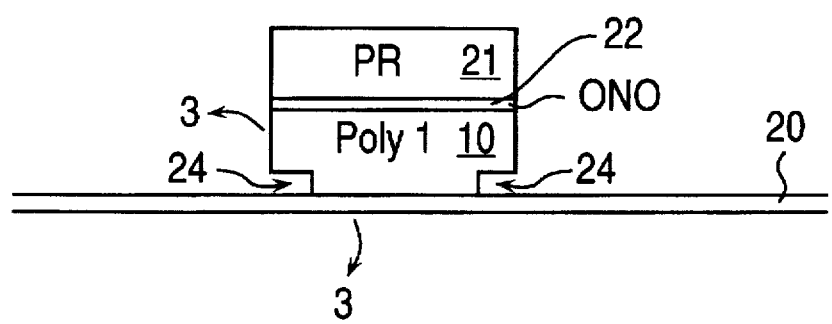
FIG. 2 is a cross-sectional elevation view of a circuit structure, specifically a polysilicon line formed from a first layer of polysilicon.

The formation of the stringers in the structure of FIG. 1 is shown in more detail in FIGS. 2–7. In FIG. 2, one of the lines 10 is shown after it has been formed from a first layer of polysilicon. The first layer of polysilicon in one embodiment has a thickness of approximately 3500 Å. Before masking and etching of this polysilicon layer, it is covered with an insulative layer which for the discussed embodiment comprises 400 Å of ONO 22. Photoresist members 21 are formed on the ONO under discussion layer 22 and then the ONO layer 22 and polysilicon are etched in an anisotropic plasma etching step using, for example, Cl and/or ClHe.

During the etching of the first polysilicon layer, overhangs 24 form at the bases of the lines 10. The overhangs 24 are the source of the stringer problem which is described below. These overhangs result in part because the polymer build-up which occurs during the etching of the polysilicon is thinnest at the bases of the lines 10 and since some overetching is used to assure that all of the exposed polysilicon is etched.

During the over-etching the thinner polymer at the bases presents the etchant from maintaining its anisotropic characteristic.

In some processes, the first layer 22 of polysilicon is etched into lines 10 before the ONO layer 22 is formed. When this occurs the subsequently formed ONO layer fills the overhangs 24 and prevents the formation of stringers, because the oxide in the ONO stack 22 is thinner than the side oxide 25. This processing, however, requires more etching capacity which is not always available, particularly where a programmable memory array is being added to an existing process. For example, when a ROM array in a microcontroller is converted to an electrically programmable array, the etching capacity in the existing process may not be sufficient.

Figure 3:
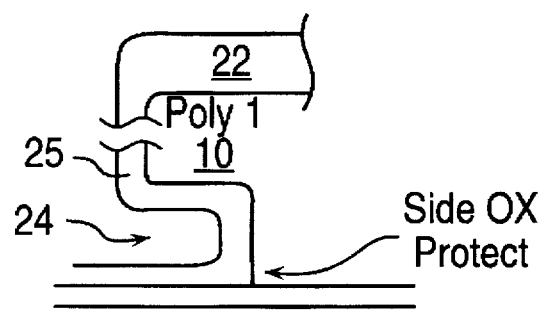
FIG. 3 is an exploded view of a portion of the structure of FIG. 2 generally taken through section line 3—3 of FIG. 2.

After the formation of the lines 10, the photoresist 21 is removed and a side oxide 25 is formed to protect the sides of the lines 10 as shown in FIG. 3. Note that this oxide extends into the overhangs 24 thereby creating overhang regions which are insulated from the polysilicon lines.

Figure 4:
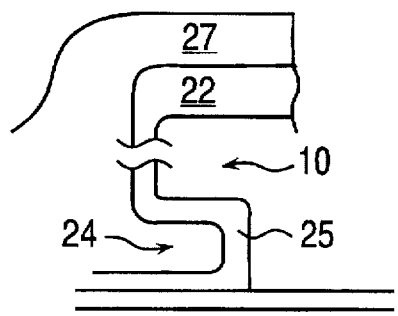
FIG. 4 illustrates the structure of FIG. 3 after a second layer of polysilicon has been deposited.

Now a second layer of polysilicon 27 is deposited over the substrate which layer for the embodiment under discussion is approximately 3500 Å thick. This layer fills the overhangs 24 as shown in FIG. 4.

Figure 5:
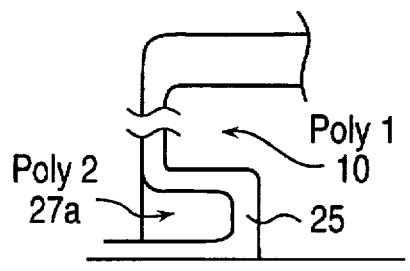
FIG. 5 illustrates the structure of FIG. 4 after the second layer of polysilicon has been etched.

In a subsequent processing step, as previously mentioned, this second layer of polysilicon is etched to form the lines 11 of FIG. 1 again using an anisotropic etching step such as the one used to form the lines 10. When this occurs the polysilicon in the overhangs 24 is not etched since it is not exposed in the vertical direction. Thus, stringers 27a are formed within the overhangs as shown in FIG. 5. Note the overhang 24 becomes larger after its oxidation and more polysilicon is in the overhang than an overetching step can remove. Also, the critical dimensions and profile of the word lines are changed by long overetching.

Figure 6:
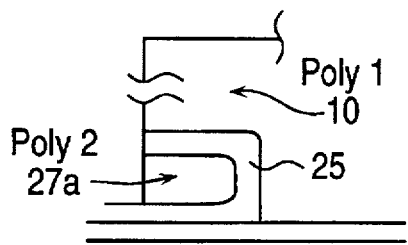
FIG. 6 illustrates the structure of FIG. 5 after an additional etching step.
Figure 7:
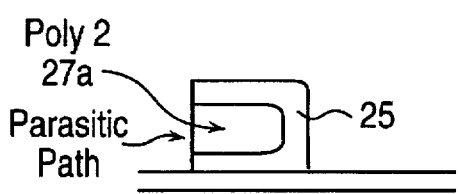
FIG. 7 illustrates the structure of FIG. 6 after a polysilicon etching step.

Next, as shown in FIG. 7, the insulative layers are etched away. However, the insulative layer 25 between the stringer 27a and the line 10 remains since it is deposited between these two polysilicon members as shown in FIG. 6. (As currently preferred, the same etching step is used to do the etching shown in FIGS. 6 and 7.)

During the etching step where the segments 14 of the lines 10 are removed as shown in FIG. 1, the stringers 27a remain (see FIG. 7) since they are protected by the insulative layer 25. Thus, the stringers formed in the bases of line 10 remain after the exposed segments of lines 10 are removed.

Figure 8:
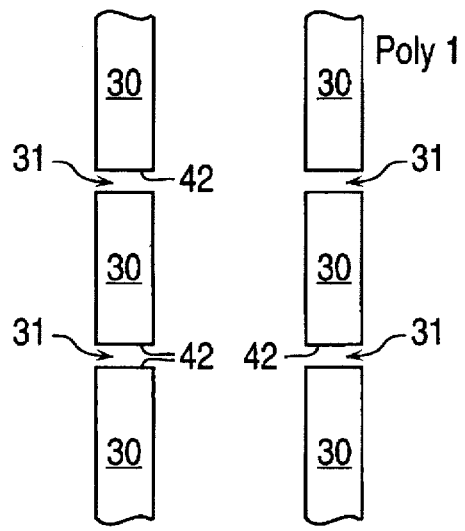
FIG. 8 is a plan view showing line segments for a memory array etched from a first layer of polysilicon in accordance with the present invention.

Referring to FIG. 8, when the memory array is fabricated in accordance with the improvement of the present invention, interstices are formed in the lines fabricated from the first layer of polysilicon. Thus, instead of a continuous line as shown in FIG. 1, there are a plurality of line segments 30. Line segments 30, fabricated from the first layer of polysilicon, are shown in FIG. 8 and include the interstices 31 appear as breaks or gaps in the lines. These gaps are formed between the sites at which the word lines will be subsequently formed. The mask used to define the polysilicon lines from the first layer of polysilicon is altered so that breaks in the lines occur. Thus, the interstices 31 are formed simultaneously with the fabrication of the line segments 30. When the line segments 30 are etched using the anisotropic etching as previously described (see FIG. 2) the overhangs are formed. The overhangs form along the length of the line segments and also along the line segment ends 42 which face each other at the interstices 31. Thus the overhangs extend along the full length of each of the line segments line 30 and along the ends 42 of each of the segments.

Figure 9:
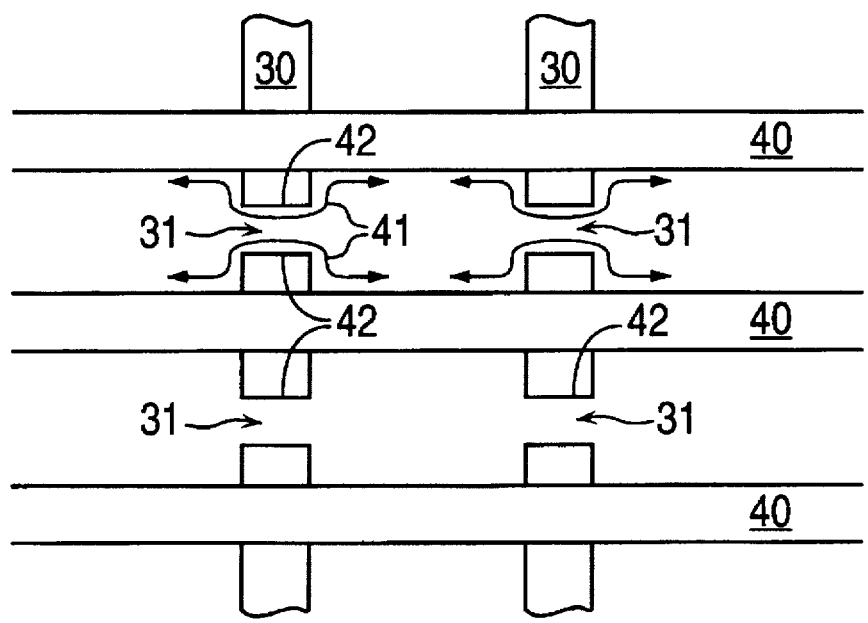
FIG. 9 shows the line segments of FIG. 8 after subsequent formation of word lines.

The steps for fabricating of the memory array when using the present invention is the same as previously described except for the formation of the interstices 31. Consequently, word lines are formed as shown by word lines 40 of FIG. 9 from a second layer of polysilicon. As previously described, the overhangs associated with the line segments 30 and ends 42 are filled with polysilicon from the second polysilicon layer. However, because of the interstices the polysilicon stringers do not extend from one word line to another. Rather, as shown by paths 41, each stringer (after the word line segments are etched away to form the floating gates) starts and ends on the same word line. That is, there are no parasitic paths from word line to word line instead the stringers form parallel paths along word lines. These stringers have no harmful effect upon the operation of the memory array.

What occurs is that the interstices provide a diversionary path for the overhangs and the subsequently formed stringers. The interstices are selected so that the resultant stringers formed do not adversely affect the operation of the circuit. This is a substantially different approach than removing the stringers or other processing which prevents the formation of the stringers. As was shown above, the improvement of the present invention is realized with a single mask change.

Figure 10:
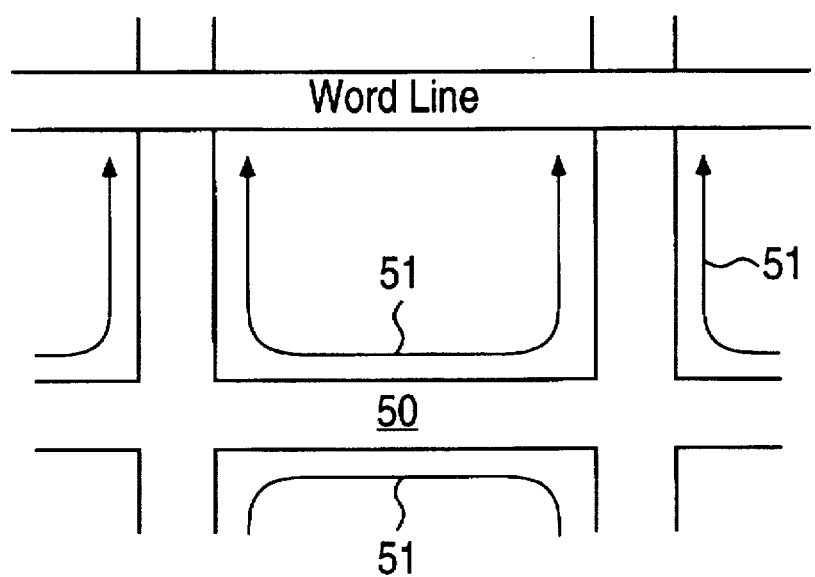
FIG. 10 is a plan view of lines formed from the first layer of polysilicon which are parallel to the subsequently formed word lines.

A similar result can be achieved by forming lines from the first layer of polysilicon which are parallel to the subsequently formed word lines. Line 50 illustrates this in FIG. 10. After etching the lines formed from the first layer of polysilicon in the alignment with the word lines, the stringers follow the path 51 of FIG. 10. Note here, instead of interstices additional polysilicon is used to form the new diversionary path. Other dummy features may be formed to cause rerouting of the stringers or breaks in the conductive paths provided by the stringers.

We claim:

1. A process for forming a semiconductor device with altered parasitic paths, comprising the steps of:

forming a first layer on a substrate;

etching the first layer to form structures from the first layer;

etching gaps in the structures simultaneously with the step of etching the first layer, which gaps provide alternate paths for subsequently formed stringers;

forming a conductive second layer over the first layer; and anisotropically etching the second layer to form circuit elements, such that a portion of the second layer remains, leaving the stringers which define parasitic paths, the parasitic paths being formed along the gaps to provide the alternate parasitic paths.

2. The process defined by claim 1 wherein the first layer comprises polysilicon.

3. The process defined by claim 2 wherein the step of etching the first layer to form the structures results in the formation of overhangs along the bases of the structures.

4. The process defined by claims 1 or 3 wherein the step of forming a conductive layer comprises the step of forming a polysilicon layer.

5. In a process for fabricating memory devices on a semiconductor substrate where first parallel spaced-apart polysilicon lines are formed in a first direction and then second parallel spaced-apart polysilicon lines are formed in a second direction orthogonal to the first direction, and where the first lines are etched in alignment with the second lines to form floating gates used to store electrical charge for the memory devices, an improvement in this process comprising the steps of:

forming breaks in the first lines between future sites of the second lines simultaneously with the formation of the first lines; and forming a second layer such that parasitic paths formed from the second layer are diverted through the breaks.

6. The process defined by claim 5 wherein the second lines are formed by anisotropic etching.

7. The process defined by claim 6 wherein the first lines are formed by anisotropic etching.

8. The process defined by claim 6 wherein the etching of the first line in alignment with the second line employs anisotropic etching.

* * * * *

UNITED STATES PATENT AND TRADEMARK OFFICE
CERTIFICATE OF CORRECTION

PATENT NO.    : 5,639,681
DATED         : June 17, 1997
INVENTOR(S)   : Carmody et al.

It is certified that error appears in the above-identified patent and that said Letters Patent is hereby corrected as shown below:

In column 4 at line 4 delete "22"

In column 4 at line 6 insert --22-- following "layer" and prior to "fills"

Signed and Sealed this

Seventh Day of October, 1997

Attest:

BRUCE LEHMAN

Attesting Officer      Commissioner of Patents and Trademarks